United States Patent [19]

Lenie et al.

[11] 4,168,990
[45] Sep. 25, 1979

[54] HOT IMPLANTATION AT 1100°–1300° C. FOR FORMING NON-GAUSSIAN IMPURITY PROFILE

[75] Inventors: Camille A. Lenie, Rancho Palos Verdes; Vladimir Rodov, Los Angeles; Boris L. Hikin, Playa Del Rey, all of Calif.

[73] Assignee: International Rectifier Corporation, Los Angeles, Calif.

[21] Appl. No.: 959,683

[22] Filed: Nov. 13, 1978

Related U.S. Application Data

[63] Continuation-in-part of Ser. No. 784,273, Apr. 4, 1977, abandoned, which is a continuation-in-part of Ser. No. 728,053, Sep. 30, 1976, abandoned.

[51] Int. Cl.² .................................... H01L 21/263
[52] U.S. Cl. ................................ 148/1.5; 148/187; 357/91
[58] Field of Search .............. 148/1.5; 357/91; 148/187

[56] References Cited

U.S. PATENT DOCUMENTS

| | | | |
|---|---|---|---|
| 3,717,507 | 2/1973 | Abe | 148/1.5 |
| 3,745,070 | 7/1973 | Yada et al. | 148/1.5 |
| 4,004,950 | 1/1977 | Baruch et al. | 148/1.5 |

OTHER PUBLICATIONS

MacDonald et al., "... Hot, P Implants in Si", Radiation Effects, 6 (1970), 223-235.
Namba et al., "... Diffusion in Ion Implanted Si", Rad. Effects, 6 (1970), 115-120.
Zandveld, "Crystal Damage ... in Si", Solid St. Electronics, 21 (1978), 721.
Beanland et al., "... P Implanted at Elevated Temp.", Solid St. Electronics, 21 (1978), 357.

*Primary Examiner*—L. Dewayne Rutledge
*Assistant Examiner*—Upendra Roy
*Attorney, Agent, or Firm*—Ostrolenk, Faber, Gerb & Soffen

[57] ABSTRACT

A process is described for the particular control of process variables to produce any predetermined impurity concentration within a semiconductor body according to the relation $$\frac{\delta\mu}{\delta t} = D(t)\frac{d^2t}{dx^2}$$

where $\partial m/\partial t$ is the flux of impurities at any time t, x is the depth into the semiconductor body, and D(t) is the difficulty of the impurity as a function of time.

3 Claims, 8 Drawing Figures

HOT IMPLANTATION AT 1100°-1300° C. FOR FORMING NON-GAUSSIAN IMPURITY PROFILE

RELATED APPLICATIONS

This application is a continuation-in-part of application Ser. No. 784,273, filed Apr. 4, 1977 now abandoned, which is a continuation-in-part of application Ser. No. 728,053, filed Sept. 30, 1976 now abandoned, both in the names of Camille A. Lenie, Vladimir Rodov, and Boris L. Hikin and assigned to the assignee of the present application.

BACKGROUND OF THE INVENTION

1. Field of the Invention

This invention relates to the control of the impurity distribution within a semiconductor body, and more particularly relates to a novel control process for forming a wide range of predetermined impurity distributions.

2. Description of the Prior Art

The properties of semiconductor devices are determined in large measure by the profile of the impurity concentration within the semiconductor body. Impurities are introduced into the body by various mechanisms such as diffusion from gases, liquids or solids and ion implantation. Control of impurity concentration obtained by these processes has been limited since there are only two relationships previously known between the impurity concentration and the distance coordinate x below the surface of the semiconductor body. If an infinite source of impurities is provided at the semiconductor surface, the relation between impurity concentration n(x) at some depth x below the wafer is given by:

$$n(x) \approx \text{erfc}\left(\frac{x}{2\sqrt{Dt}}\right)$$

Where erfc is the complementary function of error function (1-erf); and
t is time; and
D is the diffusivity of the impurities.
The diffusivity D is in turn defined as $$D = D_o \exp\left(-\frac{\Delta E}{KT(t)}\right)$$

Where $\Delta E$ = activation energy, K = Boltzman's constant, and T is absolute temperature.

If a finite source is available on the semiconductor surface, then the impurity concentration at a distance (x) into the body of the semiconductor is given by:

$$n(x) \approx \exp\left(-\frac{x^2}{4Dt}\right)$$

These concentration distributions are the only distributions available from presently available diffusion processes, and represent the generally exponentially decreasing concentration as a function of depth into the wafer surface shown in FIG. 1, for the wafer of FIG. 2. In FIG. 2, the wafer is shown schematically in cross-section and may be a monocrystalline silicon wafer with impurity atoms entering the top surface 10 of the wafer during diffusion. Other impurity concentration distributions, such as distributions which are hyperbolic or step-shaped in configuration, cannot now be predicted by the designer.

In order to obtain more complex impurity concentration profiles in devices, and to obtain a more pronounced "step" in the impurity concentration profile, designers have resorted to the epitaxial deposition of layers of one conductivity type or value on top of other conductivity layers. Epitaxial technology also allows a wide class of distribution functions n(x), but, as a rule, are less desirable than junctions formed by diffusion. Thus, to obtain a step-type impurity concentration profile of the type shown in FIG. 3, the designer might elect to epitaxially deposit an N-type layer 11 on a P-type wafer 12, as shown in FIG. 4, to produce the junction 13.

The use of an epitaxial layer in a semiconductor device is disadvantageous since the epitaxial layer has a degenerate crystal structure, as compared to bulk silicon (layer 12 in FIG. 4). Moreover, for high power semiconductor devices, where the recombination processes are essential, including high power diodes, thyristors, triacs and transistors, relatively thick epitaxial layers are needed at (for example, 4 mils), and these thicknesses are hard to make and are usually damaged and are less perfect than layers formed by the diffusion process.

BRIEF SUMMARY OF THE INVENTION

In accordance with the invention, a novel process is provided for the formation of almost any given impurity concentration within a semiconductor body by the control of the impurities at the surface of the semiconductor body, or the flux of impurities into the surface, which control follows the reverse solution of:

$$\frac{\delta n}{\delta t} = D(t)\frac{d^2 n}{dx^2}$$

Where $\partial n/\partial t$ is the flux of impurities in the body at any time t; x is the depth within the semiconductor body; and D(t) is the diffusivity of the impurity as a function of time.

The above equation can be solved for any given desired impurity concentration profile of practical value, such as one having a hyperbolic or exponential or any other profile, and the equation solution will describe the process parameters which are necessary to produce the required profile in terms of surface concentration of impurities, or surface flux (flow of impurity atoms into the wafer), the temperature of the wafer, the temperature profile, the need for movement of the wafer from process to process, as between ion implantation, diffusion and thin film processes, and the use of doped oxides and/or nitrides, and the like. Significantly, the process allows the designer to make a wide range of profiles which cannot be made by existing design procedures.

DETAILED DESCRIPTION OF THE INVENTION

Figure 1:
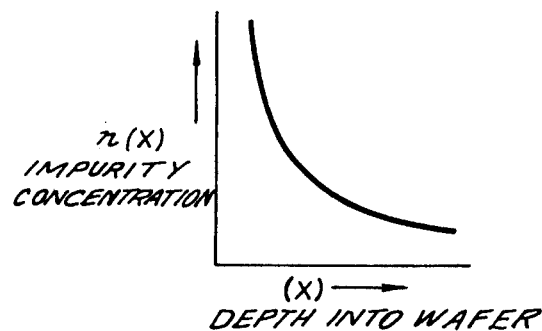
FIG. 1 shows the exponential characteristics of impurity concentration and wafer depth for diffusion from a finite or infinite source.
Figure 2:
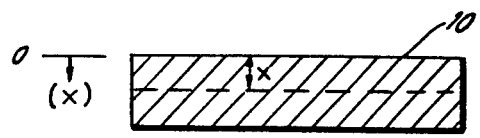
FIG. 2 shows a cross-section of a monocrystalline wafer which is to be diffused with impurities which enter the wafer from its upper surface.
Figure 3:
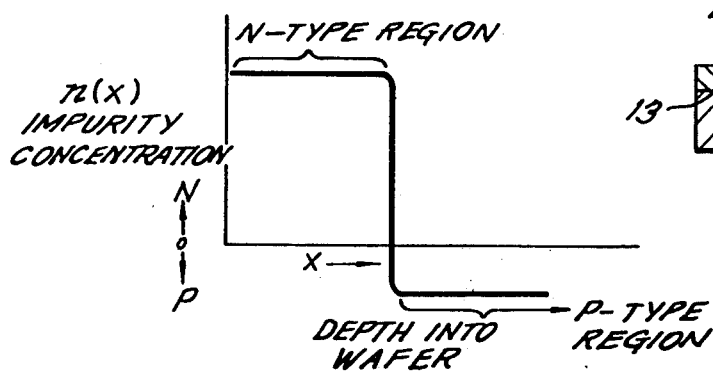
FIG. 3 shows a step-shaped characteristic of impurity concentration and wafer depth for a silicon body having an epitaxially deposited layer.
Figure 4:
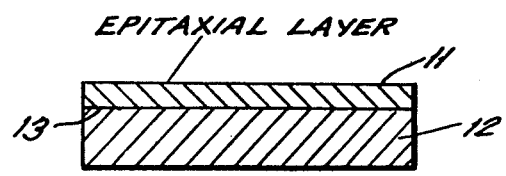
FIG. 4 shows a cross-sectional view of a silicon wafer having an epitaxially deposited layer thereon.

The present invention permits the formation of almost any type of impurity distribution which is desired by a designer for a particular type device. Thus, the invention allows the designer to calculate the necessary control functions for a desired impurity distribution such as the boundary conditions, surface concentration of dopants, flux of the dopant, temperature, and so on, and to select and control the particular equipment for carrying out the process.

The derivation of the novel relationship of the invention for the control of impurity concentration as a function of distance into the crystal is as follows:

The diffusion into a one-dimensional half-space is described by the equation:

$$\frac{\delta n}{\delta t} = D(t) \frac{d^2 n}{dx^2} \tag{1}$$

This equation can be solved to obtain a given impurity profile in terms of a given initial impurity concentration at the semiconductor surface, or in terms of the flux of impurities into the surface of the semiconductor body.

In the case where the solution is to be made in terms of surface concentration of impurities, the boundary and initial conditions are:

boundary condition:

$$n(o,t) = \phi(t) \tag{2}$$

initial condition:

$$n(x,o) = 0 \tag{3}$$

In the case where the solution to equation (1) is to be in terms of surface flux, the boundary and initial conditions are:

boundary condition:

$$-D(t)\frac{2n}{2x}\bigg|_{x=0} = I(t) \tag{2'}$$

initial condition:

$$n(x,o) = 0 \tag{3'}$$

In the above $\partial n/\partial t$ is the flux of impurities in the crystal at any time t, and at any depth x, D(t) the diffusivity of the impurity atoms as a function of time. The boundary condition, equation (2) describes the initial concentration of dopant at the crystal surface, and $\phi(t)$ is the surface concentration of dopants as a function of time. Note that $\phi(t)$ can be controlled as a process variable in any process including ion implantation, diffusion, thin epitaxial layer and thin film deposits. Moreover, impurity flux I(t) of boundary condition (2') can also be calculated and controlled.

The following shows the derivation of the solution of equations (1), (2) and (3), for the case wherein a given concentration profile is to be formed by the control of the impurity concentration at the surface of the semiconductor body. Those skilled in the art will recognize that equation (1), (2'), and (3') can be similarly solved.

Consider a function f(x), where $0 \leq x \leq \infty$. It is necessary to find functions $\phi(t)$ and D(t), where $0 \leq t \leq t^*$ are such that the solution to equations (1), (2) and (3) at the time t* is close to f(x) with any desired accuracy.

The diffusivity D depends on the time in equation (1) through the dependency of D with temperature as follows:

$$D = D_0 \exp\left(-\frac{\Delta E}{KT(t)}\right) \tag{4}$$

where $\Delta E$ = activation energy, K = Boltzman's constant, and T is absolute temperature. Note that the sign of $\phi(t)$ (the surface impurity concentration) may change, depending on a change in the type of impurities being used (from p-type to n-type or vice versa).

If the conductivity changes from n-type to p-type or vice versa, in the volume of the semiconductor, then the diffusivity D will depend on the distance coordinate x in accordance with the essential difference between the diffusion coefficients of donors and acceptors—Dd, Da, respectively.

Consider next the simple condition where Dd = Da and their temperature dependencies are similar. A real situation shall be considered later.

Variation Dd and Da with variable t is not essential. Indeed, while introducing a new variable:

$$S(t) = \int_o^t D(\tau) d\tau \tag{5}$$

where $(\tau) = f(t)$. Note that this relation calls for a possible change in diffusion temperature as a function of time, whereas prior art processes always maintain a constant diffusion temperature.

Instead of equations (1)–(3), we then obtain:

$$\frac{\delta n}{\delta S} = \frac{\delta^2 n}{\delta x^2} \tag{1''}$$

with the boundary condition:

$$n(o,S) = \phi(S) \equiv \phi(t(S)) \tag{2''}$$

and the initial condition (3).

The solution of equation (1'') is then given by the integral $$n(x,S) = \frac{x}{2\sqrt{\pi}} \int_0^S \frac{\phi(S')\exp\left(-\frac{x^2}{4(S-S')}\right)}{\sqrt{(S-S')^3}} ds' \quad (6)$$

The function f(x) needed will now be that function $\phi(S)$, for which $$\frac{x}{2\sqrt{\pi}} \int_0^{S^*\equiv S(t^*)} \frac{\phi(S)\exp\left(-\frac{x^2}{4(S^*-S)}\right)}{(S^*-S)^{3/2}} ds = f(x) \quad (7)$$

In the above, t* is the time at which the desired impurity concentration will be achieved, and is the end of the process time.

Introducing the variable $$\xi = \frac{S}{S^* - S}$$

in equation (7), then gives:

$$f(x) = \frac{x\exp\left(-\frac{x^2}{4S^*}\right)}{2\sqrt{\pi S^*}} \int_0^\infty \frac{\phi(\xi)\exp\left(-\frac{x^2}{4S^*}\right)}{\sqrt{\xi+1}} d\xi \quad (7')$$

If L is the depth in which we are interested in the diffusion profile, it will be always possible to choose t* so large that the condition $S^* \gg L^2/4$ will be satisfied. Then, in (7'), it is possible to omit the exponential factor before the integral. Note that this procedure will not be necessary if we put an additional condition on the function f(x); i.e., $$f(x)\exp\left(\frac{x^2}{4S^*}\right) \to 0$$

when $x \to \infty$. The function $\phi(\xi)$ of equation 7' is readily found from the Laplace transformation of $$\frac{\phi(\xi)}{\sqrt{\xi+1}}$$

function and hence:

$$\frac{\phi(\xi)}{\sqrt{\xi+1}} = 2\sqrt{\pi S^*} \int_{-i\infty}^{i\infty} \frac{f(\sqrt{4S^*P})}{\sqrt{4S^*P}} e^{P\xi} \frac{dP}{2\pi i} \quad (8)$$

where p is given by $p = x^2/4S^*$.

The solution described above to obtain equation (8) for the case of impurity surface concentration of $\phi(\xi)$ can be applied to equations (1), (2') and (3') to obtain a solution in terms of surface impurity flux I(t). This solution takes the form:

$$[I(t)] = \left(\frac{S^*}{S^*-S}\right)^{3/2} \cdot \sqrt{\frac{\pi}{S^*}} \int_{-i\infty}^{i\infty} F(\sqrt{4PS^*}) e^{P\frac{S}{S^*-s}} \frac{dP}{2\pi i} \quad (8a)$$

For $\phi(\xi)$ and for I(t) in equations (8) and (8a) respectively to exist, f(x) must satisfy the following conditions:

(a) f(x) can be continued analytically throughout the complex plane;
(b) $f\sqrt{4S^*P}$ is an analytical function of the variable p in the region;

(c) $\sup_{\sigma > 0} \int_{\sigma - i\infty}^{\sigma + i\infty} \left| \frac{f(\sqrt{4S^*P})}{\sqrt{4S^*P}} \right| \frac{dP}{2\pi i} < \infty$ In some cases, instead of using equation (8), it will be more convenient to use the following expression:

$$\frac{\phi(\xi)}{\sqrt{\xi+1}} = \frac{1}{2\sqrt{\pi S^*}} \int_{-\infty}^{+\infty} f(i\omega)\exp\left(-\frac{\omega^2 \xi}{4S^*}\right) d\omega \quad (8')$$

which is obtained from equation (8) by the substitution $\sqrt{4S^*P} = i\omega$ and the deformation of the integration contour.

The above relations define the process parameters needed to produce a given impurity distribution in accordance with this invention.

The restrictions (a), (b), (c) above, on f(x) essentially narrow the class of the functions which can be manipulated to obtain the exact solution (8) of the problem. Thus, piecewise, continuous functions (for example, a step-function) do not satisfy the condition (a). Instead of the step-function, it would be possible to consider a function similar to $$f(x) = \frac{1}{\exp\left(\frac{x-x_0}{\alpha}\right) + 1}$$

for $\alpha > 0$ but as small as is wanted. But this function also is not convenient because it does not satisfy condition (b); it has poles in the right half-plane of the complex variable p under $\alpha\pi < x_0$. A function such as $f(x) = e^{\alpha x} \sin B_x$ does not satisfy condition (c) when $\alpha < B$.

The following method can be used to construct a desired f(x), with less rigid requirements than (a), (b) and (c) finding a function $f_1(x)$ that:

(1) $|f_1(x) - f(x)| < \epsilon$ form any small $\epsilon > 0$ and any $x \epsilon [0, \infty]$; i.e., $f_1(x)$ is uniformly close to f(x);
(2) $f_1(x)$ satisfies (a), (b) and (c).

Requirement (1) above for the function $f_1(x)$ is essential in view of limitations of the diffusion process in a semiconductor. Violating this condition means that there is a region (or regions) of x (which can be very small) in which $f_1(x)$ will differ considerably from f(x). This could possibly lead to a substantial variation of the resistivity and perhaps to the formation of parasitic p-n junctions.

Other relationships can be derived from equations (8) and (8') which might be conveniently used by the designer. Thus, define $f_1(x)$ as:

$$f_1(x) = \sum_{n=0}^{N} f_n L_n \cdot (ax) e^{-ax} \quad (9)$$

where:

$$f_n = a \int_0^\infty f(x) L_n(ax) dx,$$

It can be shown that Laguerre polynomials above can be chosen in that way $f_1(x)$ will satisfy requirement (1) if $f(x)$ has two derivatives and $$\int_0^\infty e^{-ax}|f(x)|dx$$

converges.

Since every term of the sum (9) satisfies the conditions (a), (b) and (c), the finite sum (9) also satisfies (a), (b) and (c).

Choosing N in equation (9) large enough to satisfy the given exactness $|f_1-f|<\epsilon$ for all values of x, the next expression for the control function $\phi(\xi)$ is:

$$\frac{\phi(\xi)}{\sqrt{\xi+1}} = \sum_{n=0}^{N} f_n \phi_n(\xi) \tag{10}$$

where $\phi_n(\xi)$ according to (8) or (8') can be transformed to the form:

$$\phi_n(\xi) = \frac{e^{-S^*\frac{a^2}{\xi}}}{\sqrt{\xi}} \sum_{m=0}^{n} \frac{\binom{n}{m}\left(a\sqrt{\frac{S^*}{\xi}}\right)^m}{n!4^m} H_m\left(a\sqrt{\frac{S^*}{\xi}}\right) \tag{11}$$

where $H_n(x)$ are Hermite polynomials.

It can be seen from (11) that $\phi(\xi)$ is determined for all values of $\xi$.

In some cases, it may be more convenient to use the following expression for $\phi(\xi)$:

$$\phi(\phi) = a \int_0^\infty f(x)dx \int_{-\infty}^{+\infty} \frac{d\omega}{2\sqrt{\pi S^*}} \frac{N+1}{N} \exp\left(\frac{\omega^2\xi}{4S^*}\right) \frac{L_{N+1}(ax)L_N(i\omega) - L_{N+1}(i\omega)L_N(ax)}{ax - i\omega} \tag{12}$$

which can be obtained from (8'), (9') and (10) using Cristoffel-Dorboux's formula.

The above analysis can also be applied to equation 8(a) related to surface flux.

It is now possible to consider the application of the process of the invention to the manufacture of devices having particular impurity distributions.

First assume that it is desired to obtain a device in which the impurity concentration into the body of a wafer varies with the hyperbolic function:

$$f(x) = \frac{b}{x+a}$$

Using equation (8), the value $\phi(\xi)$, which is the surface concentration of impurities at the surface of a wafer in a diffusion process as a function of time is given as follows:

$$\frac{\phi(\xi)}{\sqrt{\xi+1}} = \frac{b\sqrt{\pi}}{\sqrt{S^*}} e^{\frac{4a^2\xi}{S^*}} \text{erfc}\left(\sqrt{\frac{4a^2\xi}{S^*}}\right) \tag{13}$$

Figure 5:
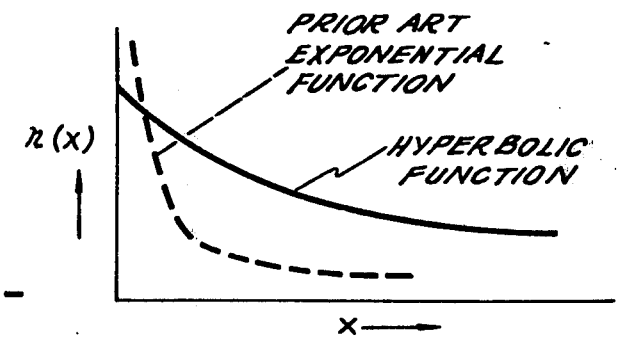
FIG. 5 illustrates a hyperbolic impurity distribution which can be obtained in accordance with the present invention.

A suitable control is then provided to vary the surface concentration of diffusion impurities as a function of time to obtain the hyperbolic function for impurity concentration, as shown in FIG. 5.

This control can also be used to control temperature as a function of time in a diffusion process, thereby again to control the surface concentration $\phi(\xi)$, as determined by equations (4), (5) and (13). A conventional computer can be programmed to calculate the value of the desired surface concentration as a function of time to automatically control the process, or an operator can manually change the temperature by following a precalculated chart of temperature (or ion current) as a function of time.

Figure 6:
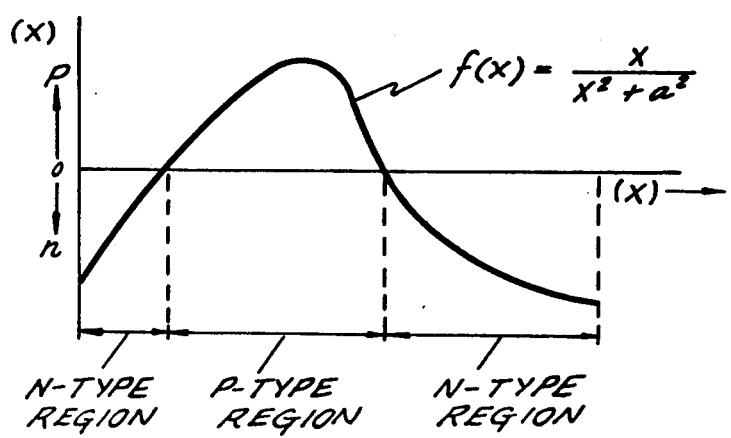
FIG 6 illustrates a transistor device impurity distribution profile which can be obtained in accordance with the invention.

As a second example of the invention, a designer may wish to make a transistor having the impurity characteristics shown in FIG. 6. The impurity concentration in FIG. 6 has the equation:

$$f(x) = \frac{x}{x^2 + a^2}$$

Using Equation (8), the surface concentration $\phi(t)$, needed to obtain this shape is:

$$\frac{\phi(\xi)}{\sqrt{\xi+1}} = \frac{\pi}{2\sqrt{S^*}} \exp\left(-\frac{a^2\xi}{4S^*}\right) \tag{14}$$

A suitable control scheme can now be provided to vary the impurity supply as required by equation (14) to produce the transistor type distribution profile of FIG. 6.

It has been stated above that present diffusion processes produce a generally exponential impurity concentration. In fact, they are not perfectly mathematical exponential distributions. However, the invention would permit the construction of a device having a perfect exponential impurity distribution of the shape:

$$f(x) = e^{-ax}$$

Using equation (8), this distribution is obtained for a surface concentration $\phi(\xi)$ which is $$\frac{\phi(\xi)}{\sqrt{\xi+1}} = \frac{1}{\sqrt{\xi}} \exp\left(-\frac{a2S^*}{\xi}\right) \tag{15}$$

The present invention can be carried out in the presence of two different impurity sources having different diffusivities which may be applied simultaneously to the semiconductor. Thus, consider a situation where donor and acceptor impurities are present with different diffusivities:

$$D_a = D_{oa} e^{-\frac{\Delta E_a}{KT(t)}} \text{ and } D_d = D_{od} \exp\left(\frac{-\Delta E_d}{KT(t)}\right)$$

$\phi(t)$ can be represented by the difference of two positive functions $\phi_d(t)$ and $\phi_a(t)$ which give the surface concentrations of donors and acceptors. Then instead of (7') we can write:

$$f(x) = \frac{x \exp\left(-\frac{x^2}{4S_d^*}\right)}{2\sqrt{\pi S_d^*}} \int_0^\infty \frac{\phi_d(\xi)\exp-\frac{x^2\xi}{4S_d^*}}{\sqrt{\xi+1}} d\xi - \tag{16}$$

-continued $$x \exp\left(-\frac{x^2}{4S_a^*}\right) \int_0^\infty \frac{\phi a(\xi) \exp\left(-\frac{x^2\xi}{4S_a^*}\right)}{\sqrt{\xi+1}} d\xi$$

where $$S_a^*d = \int_0^{t^*} D_{a,d}(t)\, dt$$

It is assumed that donors and acceptors diffuse independently. As done previously, we omit the exponential factors before the integrals in (16). Next, putting in the new variables and composing the two integrals into one:

$$f(x) = \frac{x}{2\sqrt{\pi}} \int_0^\infty e^{-\frac{x^2\eta}{4}} \left( \frac{\sqrt{S_d^*} \cdot \phi d(S_d^*\eta)}{\sqrt{S^*d\eta} + 1} - \frac{\sqrt{S_a^*} \phi a(S_a^*\eta)}{\sqrt{S_a^*\eta} + 1} \right) d\eta = \frac{x}{2\sqrt{\pi}} \int_0^\infty e^{-\frac{x^2\eta}{4}} \Phi(\eta) d\eta. \qquad (17)$$

Hence for the case of surface concentration:

$$\frac{\sqrt{S_d^*}\, \bar{\phi}d(S_d^*\xi)}{\sqrt{S_d^*\xi + 1}} - \frac{\sqrt{S_a^*}\, \bar{\phi}a(S_a^*\xi)}{\sqrt{S_a^*\xi + 1}} =$$

$$2\sqrt{\pi} \int_{-i\infty}^{i\infty} \frac{f\left(\sqrt{4P}\right)}{\sqrt{4P}} e^{P\xi} \frac{dP}{2\pi i}$$

where:

$$\phi d(t) = \bar{\phi}d\left(\frac{Sd}{S_d^* - Sd}\right), \text{ and}$$

$$\phi a(t) = \bar{\phi}a\left(\frac{Sa}{S_a^* - Sa}\right)$$

Where $\phi d$ is donor impurity surface concentration, and $\phi a$ is acceptor impurity surface concentration, and $$Sd(t) = \int_0^t Dd(t)dt, \text{ and,}$$

$$Sa(t) = \int_0^t Da(t)dt, \text{ and,}$$

$$Sa^*,d = Sa,d(t^*),$$

and $D_a$=diffusivity of acceptor impurities,
$D_d$=diffusivity of donor impurities.

Similar to the above, and for this case of impurity flux, it can be shown that:

$$\frac{(S_d^*)^{3/2} \bar{I}d(S_d^*\xi)}{\sqrt{(S^*\xi + 1)^3}} - \frac{(S_a^*)^{3/2} \bar{I}_a(S_a^*\xi)}{\sqrt{(S^*\xi + 1)^3}} =$$

$$\sqrt{\pi} \int_{-i\infty}^{i\infty} f(\sqrt{4P}) e^{P\xi} \frac{dP}{2\pi i}$$

where $I_d$ is donor flux and $I_a$ is acceptor flux. The function $\Phi$ placed under the integral can be calculated from formula (8). The above Equation (17) allows the designer to calculate the necessary surface concentration (or flux) for the simultaneous diffusion of acceptors and donors to produce a given impurity profile. There are an infinite number of ways to construct such functions $\phi d(t)$ and $\phi a(t)$ so that their linear combination [within the brackets of the integral in equation (17)] gives $\Phi(t)$.

One method of doing this is to set $\phi d(S_d^*\eta) \equiv 0$ for those values of $\eta$ when $\Phi(\eta)<0$; and $\phi a(S_a^*\eta) \equiv 0$ for those values of $\eta$ when $\Phi(\eta)>0$. Along with these additional conditions, both functions $\phi a(\eta)$ and $\phi d(\eta)$ are determined by one single value of $\Phi(\eta)$.

In real time $\phi a(t)$, and $\phi d(t)$ may be simultaneously unequal to zero.

Procedures (16) and (17) and those dealing with surface flux can be easily generalized for the case of the diffusion of various impurities.

There are a few practical limitations on the selection of the function $\phi d(t)$. For example, the modulus of $\phi(t)$ is restricted because it is not possible to create the infinite concentration of the impurity in the surface. Moreover, the concentration should not vary so quickly that it exceeds the response capabilities of the equipment available for the control process.

As has been previously pointed out, the equations of the invention may be solved for the surface concentration $\phi(t)$, as well as for the surface flux I(t), which can be easily controlled as when using ion-implantation process techniques. Moreover, surface concentration (used in conventional diffusion processes) and flux of impurity in the surface can be used as control functions interchangeably. Within the limitations of the present ion sources available and other subassemblies of the system, a very wide range of concentrations of dopant ions can be implanted, in a very controllable way, in the surface of the semiconductor. Crystal damage introduced by present ion-implantation techniques can be reduced by annealing. Improvements in ion-implantation equipment can be expected and will make the technique even more valuable for the practical implementation of the present invention. Furthermore, the invention can be carried out using a combination of ion-implementation technology with deposited films on the surface of the semiconductor, such as oxides, nitrides, etc. This would provide a higher degree of freedom in achieving any desired impurity concentration from an implanted dopant film source or from the film-semiconductor interface. In other words, the ion-implantation can give a defined impurity surface concentration either by direct implantation in the semiconductor, or by implantation in a film on the semiconductor, or by using the film as a mask to control even more the concentration and penetration of the impurity in the semiconductor or desired localized areas of the semiconductor surface.

Presently available diffusion furnaces have a relatively high thermal mass and, as a result, a rather slow thermal response. This limits the rate of change of the impurity concentration during the diffusion process when used with the present invention. However, diffusion furnaces are being developed with a much faster thermal response. Also computerized diffusion systems controlling temperature, time and the programmed functions of other peripheral diffusion equipment equipment such as gas systems, boat pushers and pullers, are available and can be used to implement the present invention.

Figure 7:
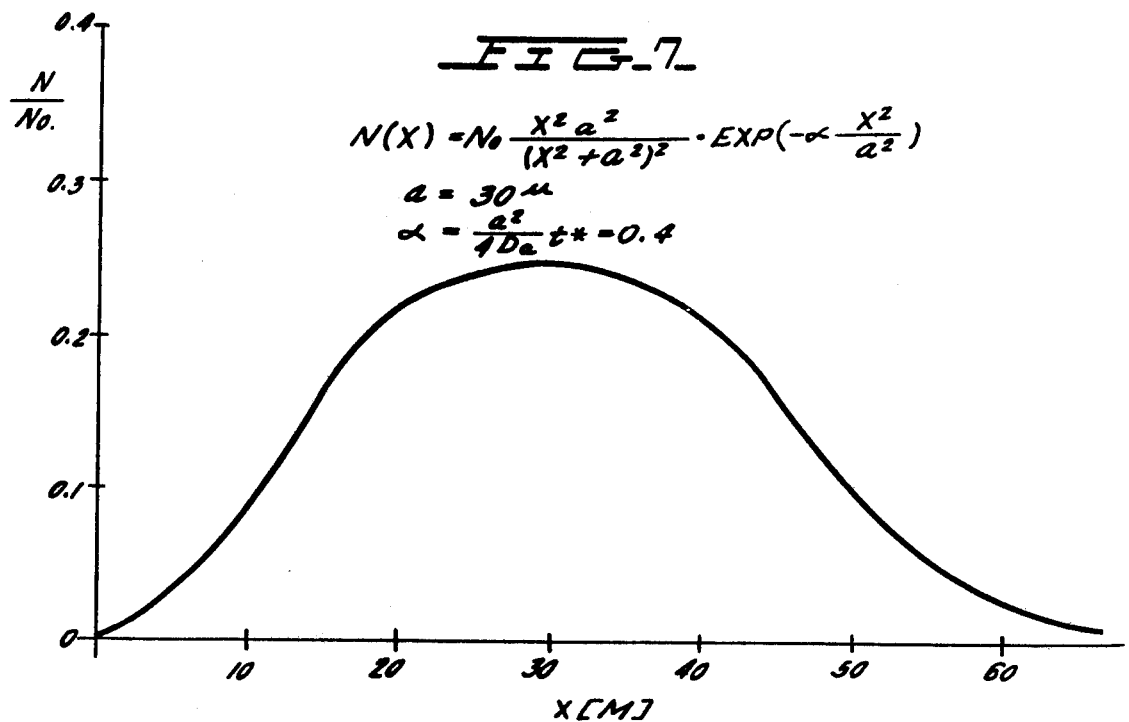
FIG. 7 shows a particular and unusual diffusion profile which can be produced when using the process of the present invention.

A further example of a diffusion profile which can be obtained with the present invention is shown in FIG. 7, with both donor and acceptor atoms present. The desired impurity distribution is given by the following equation:

$$(Na - Nd) = f(x) = No \frac{x^2 a^2}{(x^2 + a^2)} e^{-\alpha \frac{x^2}{a^2}}$$

In the above, a is selected to be 30 microns, and $\alpha$ is:

$$\alpha = a^2/4Dat^* = 0.4$$

Figure 8:
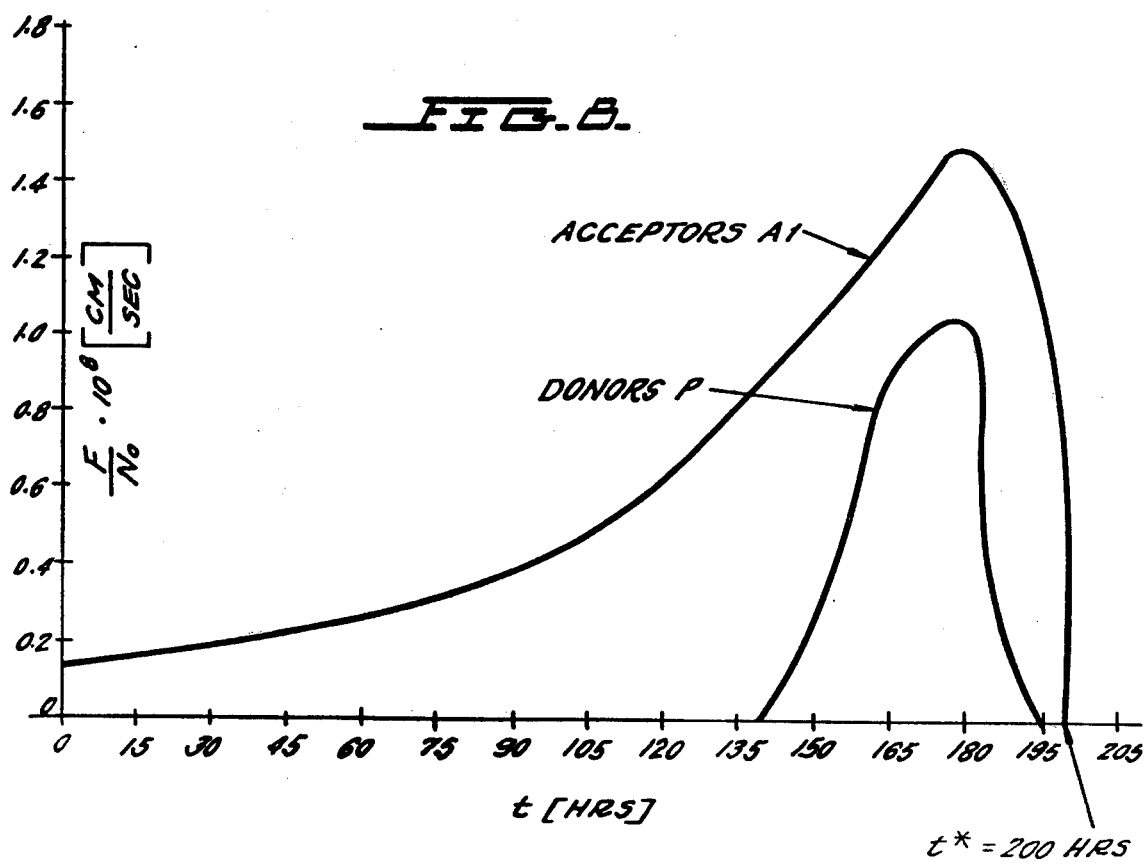
FIG. 8 shows the values of donor and acceptor fluxes needed to produce the profile of FIG. 7.

To produce the distribution described above in FIG. 7, an ion implantation apparatus is selected, having both a supply of aluminum ions and phosphorous ions. The flux of the acceptor and donor beams, at a chosen diffusion temperature of 1250° C. is shown in FIG. 8, where the flux is stated in terms of beam current density, calculated from the equation:

$$J = qZF;$$

where J is current density, q is the electron charge, Z is valence of the chosen ions and F is the ion flux. FIG. 8 shows two curves, one for the acceptor ions, and the other for the donor ions, which are introduced after about 138 hours into the process. The diffusion temperature is held at 1250° C. during the implantation process. In practice, this will require a semiconductor processing system, capable of simultaneous ion implantation and high temperature diffusion. The use of the above simultaneous ion implantation high temperature (i.e., about 1100°–1300° C.) diffusion system is new and is part of the present invention, and can be carried out with presently existing semiconductor equipment technology.

Although a preferred embodiment of this invention has been described, many variations and modifications will now be apparent to those skilled in the art, and it is therefore preferred that the instant invention be limited not by the specific disclosure herein but only by the appended claims.

We claim:
1. The process of forming a given non-Gaussian impurity distribution within a semiconductor body comprising the steps of applying an impurity ion beam to said semiconductor body, and simultaneously applying a relatively high diffusion temperature of about 1100° to 1300° C. to said semiconductor body.
2. The process of claim 1, wherein a first beam of acceptor ions and a second beam of donor ions are simultaneously applied to said semiconductor body.
3. The process of claim 1, wherein said process comprises varying, during said process, the flux of impurity ions into the surface of said semiconductor body at least approximately according to the relation:

$$I(t) = \left(\frac{S^*}{S^* - S}\right)^{3/2} \cdot \sqrt{\frac{\pi}{S^*}} \int_{-i\infty}^{i\infty} f_1(\sqrt{4PS^*}) e^{P\left(\frac{S}{S^* - S}\right)} \frac{dP}{2\pi i}$$

where I(t)=impurity ion flux,
$f_1(x)$=the closest approximate impurity distribution shape to that required within a required accuracy;
x=the distance from the surface of the semiconductor body into any point within the body;
t=time
t*=the time at which the process is completed and the desired impurity distribution is achieved;

$$P = \frac{x^2}{4S^*}$$

$$S^* = S(t) = \int_0^t D(\tau)d\tau;$$

$$D(t) = \text{diffusivity } D_0 e^{-\frac{\Delta E}{KT(t)}};$$

$\Delta E$ = activation energy;
T = absolute temperature;
and terminating said process at the end of said time t*.

* * * * *